(12) United States Patent
Kim et al.

(10) Patent No.: US 10,028,373 B2
(45) Date of Patent: Jul. 17, 2018

(54) HEAT RADIATING MEMBER AND PRINTED CIRCUIT BOARD INCLUDING SAME

(71) Applicant: SAMSUNG ELECTRO-MECHANICS CO., LTD., Suwon-si, Gyeonggi-do (KR)

(72) Inventors: Hye Seong Kim, Suwon-si (KR); Eun Sang Na, Suwon-si (KR); Ok Nam Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/228,536

(22) Filed: Aug. 4, 2016

(65) Prior Publication Data
US 2017/0048964 A1  Feb. 16, 2017

(30) Foreign Application Priority Data
Aug. 12, 2015 (KR) ........................ 10-2015-0113826

(51) Int. Cl.
| H05K 1/02 | (2006.01) |
| H05K 1/11 | (2006.01) |
| H05K 1/18 | (2006.01) |
| H01L 23/36 | (2006.01) |
| H01L 21/48 | (2006.01) |
| H05K 7/20 | (2006.01) |

(52) U.S. Cl.
CPC ......... H05K 1/0206 (2013.01); H05K 1/0204 (2013.01); H01L 21/4882 (2013.01); H01L 23/36 (2013.01); H05K 1/0212 (2013.01); H05K 1/115 (2013.01); H05K 1/18 (2013.01); H05K 7/20154 (2013.01); H05K 2201/10416 (2013.01)

(58) Field of Classification Search
CPC ............... H05K 1/0206; H05K 1/0204; H05K 2201/10416
See application file for complete search history.

(56) References Cited

U.S. PATENT DOCUMENTS

| 5,381,042 A * | 1/1995 | Lerner ................. H01L 21/565 257/712 |
| 6,295,200 B1 * | 9/2001 | Schmidt ............. H01L 21/4882 165/185 |
| 7,462,784 B2 | 12/2008 | Kariya et al. |
| 8,859,908 B2 * | 10/2014 | Wang .................. H05K 1/0206 174/252 |
| 9,661,738 B1 * | 5/2017 | Jacobsson ............ H05K 1/0206 |
| 2014/0347821 A1 * | 11/2014 | Bendani .............. H01L 23/3677 361/720 |

FOREIGN PATENT DOCUMENTS

KR   10-2000-0055589 A   9/2000

* cited by examiner

*Primary Examiner* — Ishwarbhai B Patel
(74) *Attorney, Agent, or Firm* — McDermott Will & Emery LLP

(57) ABSTRACT

A heat radiating member includes a body region having a first main surface and a second main surface opposing each other and lateral surfaces connecting the first main surface and the second main surface and having concave surfaces, and a curved surface region formed to have a convex surface on an edge at which at least one of the first main surface and the second main surface meets one of the lateral surfaces.

7 Claims, 2 Drawing Sheets

'A'

HEAT RADIATING MEMBER AND PRINTED CIRCUIT BOARD INCLUDING SAME

CROSS-REFERENCE TO RELATED APPLICATION(S)

This application claims the benefit of priority to Korean Patent Application No. 10-2015-0113826, filed on Aug. 12, 2015 with the Korean Intellectual Property Office, the entirety of which is incorporated herein by reference.

TECHNICAL FIELD

The present disclosure relates to a heat radiating member and a printed circuit board including the same.

BACKGROUND

In accordance with the trend towards miniaturization and weight reduction of electronic devices, a printed circuit board including an embedded electronic component, such as a semiconductor device or the like, has recently been developed.

The electronic component is mounted inside the printed circuit board and a build-up layer is formed to electrically connect the electronic component, thereby enabling further miniaturization and higher densification.

In the printed circuit board in which the electronic component is embedded, heat generated by the electronic component is radiated through a via serving as an interlayer signal path. Heat generated by a circuit pattern and heat generated by the driving of the electronic component are limited to only being radiated through the via. The heat may cause problems, including a reduction in the service life of the electronic component and degradations in the performance thereof.

To solve the above problems, a heat radiating member may be embedded inside a printed circuit board in a manner similar to an electronic component, and thus, heat may be more easily radiated.

The heat radiating member may be formed of a conductive material having high thermal conductivity, and may be embedded inside a substrate in a manner similar to an electronic component. While the heat radiating member is embedded inside the substrate, spaces in the vicinity of the heat radiating member are filled with an insulating resin.

When the different materials constituting the heat radiating member and the resin are not properly bonded, delamination may occur at an interface between the heat radiating member and the resin. Delamination between the heat radiating member and the resin may reduce the reliability of the printed circuit board in which the heat radiating member is embedded.

Thus, there is ongoing research into a heat radiating member that has excellent heat radiation characteristics and improved adhesion with the resin.

SUMMARY

An exemplary embodiment in the present disclosure provides a heat radiating member improving the reliability of a printed circuit board in which the heat radiating member is embedded by improving adhesion between the heat radiating member and a resin, and a printed circuit board including the same.

According to an exemplary embodiment in the present disclosure, a heat radiating member includes: a body region including a first main surface and a second main surface opposing each other, and lateral surfaces connecting the first main surface and the second main surface and having concave surfaces; and a curved surface region formed to have a convex surface on an edge at which at least one of the first main surface and the second main surface meets one of the lateral surfaces.

When a virtual circle is drawn inside the curved surface region and a radius of the virtual circle is a radius of curvature of the curved surface region, the radius of curvature of the curved surface region may be within a range of 2 μm to 40 μm.

A width between an end of the first main surface and the second main surface and a maximum concave position of the lateral surfaces may be within a range of 5 μm to 50 μm.

The body region may be formed of copper (Cu).

The curved surface region may be formed of copper (Cu).

The first main surface and the second main surface of the body region may have surface roughness properties.

The curved surface region and the first main surface or the second main surface of the body region may be provided with a step portion.

The step portion may have a thickness within a range of 2.0 μm to 8.4 μm.

A thickness of the body region may be 250 μm or less.

According to another exemplary embodiment in the present disclosure, a printed circuit board includes: a heat radiating member including a body region having a first main surface and a second main surface opposing each other, and lateral surfaces connecting the first main surface and the second main surface and formed to be inwardly concave, and a curved surface region formed to have a curved surface on an edge at which at least one of the first main surface and the second main surface meets the lateral surfaces; and a resin formed to surround the heat radiating member.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
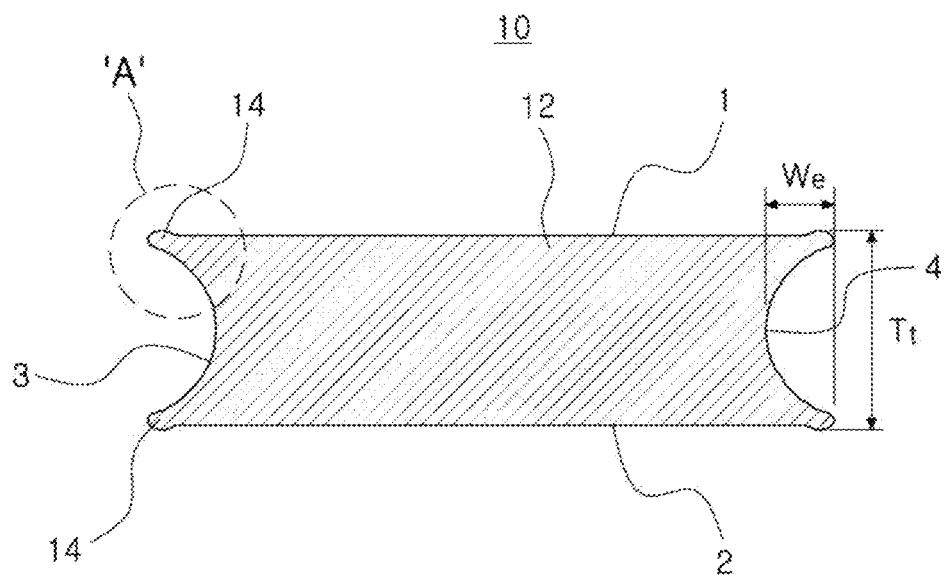
FIG. 1 is a cross-sectional view schematically illustrating a heat radiating member according to an exemplary embodiment.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Hereinafter, a heat radiating member according to an exemplary embodiment will be described.

Figure 2:
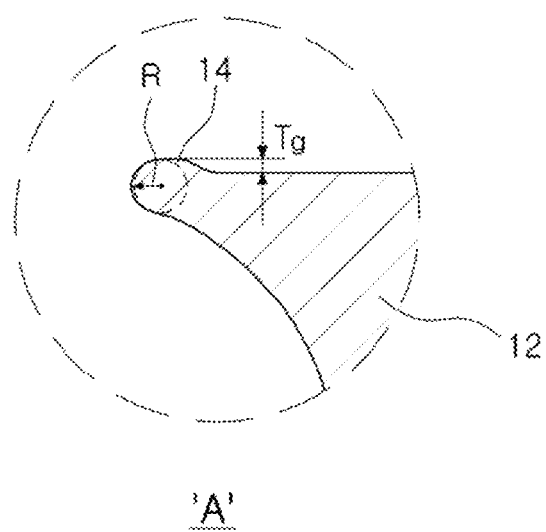
FIG. 2 is an enlarged view of portion A of FIG. 1.

FIG. 1 is a cross-sectional view schematically illustrating a heat radiating member according to an exemplary embodiment, and FIG. 2 is an enlarged view illustrating portion A of FIG. 1.

With reference to FIGS. 1 and 2, a heat radiating member 10 according to an embodiment includes a body region 12 having a first main surface 1 and a second main surface 2 opposing each other, and lateral surfaces 3 and 4 connecting the first main surface 1 and the second main surface 2 and having a concave surface; and a curved surface region 14 formed to have a convex surface on an edge at which at least one of the first main surface 1 and the second main surface 2 meets one of the lateral surfaces 3 and 4.

The body region 12 may be formed of a conductive metal. The conductive metal may be copper (Cu), but is not limited thereto.

A thickness $T_t$ of the body region 12 may be adjusted according to a type of a printed circuit board. The thickness $T_t$ thereof may be 250 μm or less, but is not limited thereto. A width of the body region 12 may be adjusted according to an electronic component and a circuit pattern.

The lateral surfaces 3 and 4 of the body region 12 may have concave surfaces.

A surface of the body region 12 may have surface roughness properties through a surface treatment.

By the surface treatment, a range of a radius R of curvature of the curved surface region 14 may be controlled. The surface treatment may be performed using a physical or chemical treatment method.

The lateral surfaces 3 and 4 are the first lateral surface 3 and the second lateral surface 4, and the lateral surfaces may be formed to be concave when the body region is manufactured.

In detail, the body region 12 including the lateral surfaces 3 and 4 may be formed through a process of exposing, developing, separating, or etching a metal plate raw material having a predetermined thickness.

The etching process may include chemical etching. While a side portion is cut to a predetermined size in the etching process, the side portion may be formed to be concave inwardly of the body region. In other words, the lateral surfaces 3 and 4 may have shapes curved to be concave in opposing directions.

When an indentation from an end of the first main surface 1 or an end of the second main surface 2 to a maximum concave position of the lateral surfaces 3 and 4 is the side portion, a width $W_e$ of the side portion may be within a range of 5 μm to 50 μm.

In a case in which the width of the side portion is less than 5 μm, a structure in which the side portion and a resin are adhered to each other is not obtained when the heat radiating member is embedded in a substrate. In a case in which the width of the side portion exceeds 50 μm, a distance in which a resin is moved inwardly of the body region is greater, and thus, adhesion between the side portion and the resin may be decreased.

When the body region is manufactured through the etching process described above, an edge at which the first main surface 1 contacts the first lateral surface 3 and the second lateral surface 4, and an edge at which the second main surface 2 contacts the first lateral surface 3 and the second lateral surface 4, may have sharp shapes. In addition, a radius of curvature of the edge may be 2.0 μm. When the body region having the edge with the sharp shape is embedded in a circuit board, an empty space around the body region may be filled with a resin.

When the empty space is filled with resin and the resin having fluidity is subject to heat and pressure, when the body region having the edge having the sharp shape is embedded in the circuit board, a distance by which the resin is moved may be increased.

When the distance by which the resin is moved is increased, a rate of moving of the resin may be decreased while retaining the same stacking time. Thus, as the resin reaches a surface of the body region, a time in which the resin and the body region are sufficiently combined with each other is shortened.

This may lead to an absence of adhesion at an interface between the two different materials constituting the body region and the resin, and delamination at the interface therebetween may subsequently occur. The reliability of the circuit board may be reduced due to the delamination of the body region and the resin.

According to an exemplary embodiment in the present disclosure, the heat radiating member 10 includes the curved surface region 14 to allow the edges of the body region 12 to have a curved surface, thereby preventing a delamination defect inside a substrate, which may cause the problems described above.

The curved surface region 14 may be formed of the same material as that forming the body region. The material thereof may be a material including copper (Cu), but is not limited thereto.

The curved surface region 14 may be formed by plating a surface of the body region 12, and the curved surface region and the body region may be integrated such that a boundary therebetween may not be visible to the naked eye.

The curved surface region 14 may be formed on at least one of an edge at which the first main surface 1 of the body region 12 is individually in contact with the first lateral surface 3 and the second lateral surface 4, and an edge at which the second main surface 2 is individually in contact with the first lateral surface 3 and the second lateral surface 4.

An upper portion of the curved surface region 14 may be located higher or lower than the first main surface 1 or the second main surface 2 of the body region 12 according to a surface treatment method. In the heat radiating member according to an exemplary embodiment, the upper portion of the curved surface region may be located higher than the first main surface or the second main surface, but is not limited thereto.

Thus, a step portion $T_g$ may be formed between the curved surface region 14 and the first main surface 1 or the second main surface 2 of the body region 12.

Due to the step portion $T_g$ between the curved surface region 14 and the first main surface 1 or the second main surface 2 of the body region 12, a surface area of the edge at which the resin contacts the heat radiating member is increased, improving the adhesion between the resin and the heat radiating member by an anchoring effect of the resin.

A size of the curved surface region 14 may be controlled by a surface treatment of the body region.

When the size of the curved surface region 14 is increased, the width of the side portion may be decreased, and thus, the delamination defect may be reduced.

When a virtual circle is drawn inside the curved surface region 14 and a radius of the circle is a radius R of curvature of the curved surface region, the radius R of curvature of the curved surface region may be within a range of 4 μm to 40 μm.

When the radius R of curvature of the curved surface region is within a range of 2 μm to 40 μm, the delamination defect at an interface with a resin may be prevented.

In a case in which the radius of curvature of the curved surface region is less than 2 μm, an effect of preventing the delamination defect may not be secured. In a case in which the radius of curvature of the curved surface region exceeds 40 μm, when the heat radiating member is embedded in the same substrate, as a height of the heat radiating member is increased, the heat radiating member is limited to being embedded in the substrate.

Hereinafter, a printed circuit board including a heat radiating member according to an exemplary embodiment will be described.

Figure 3:
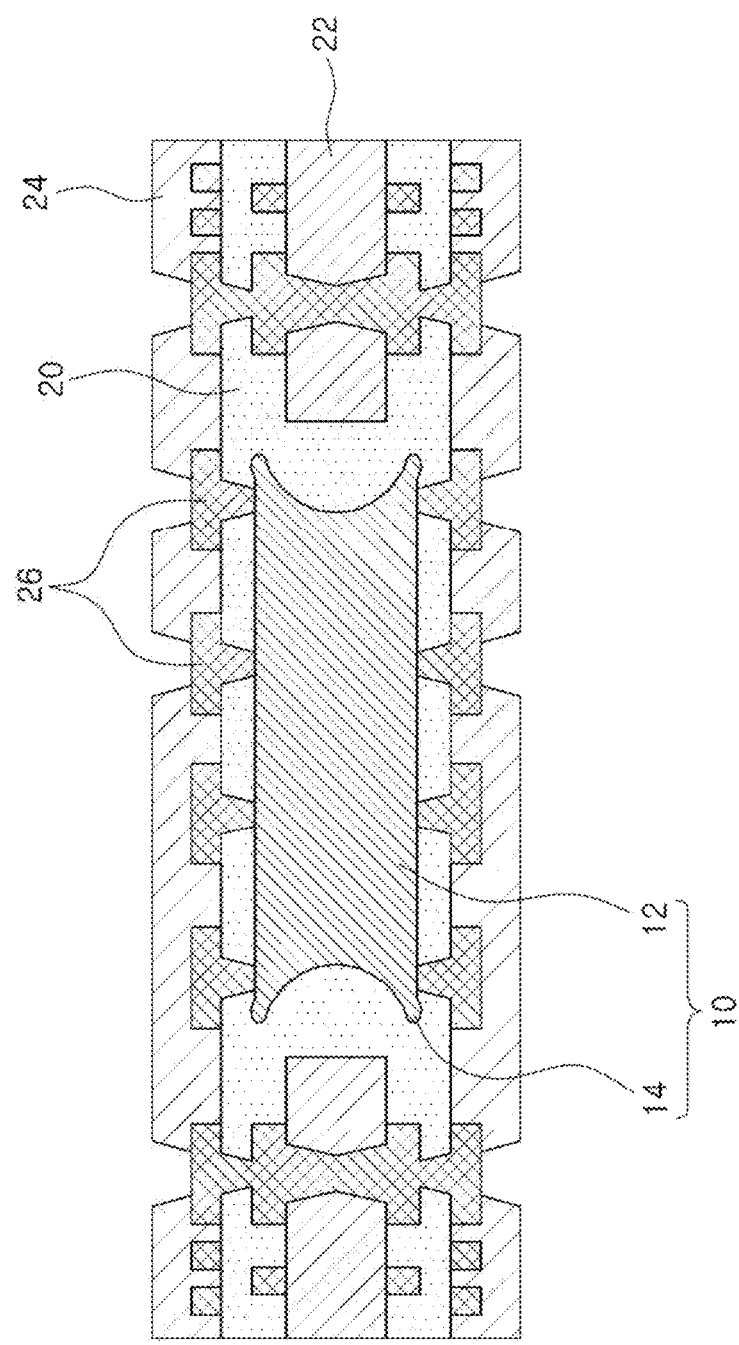
FIG. 3 is a cross-sectional view schematically illustrating a printed circuit board in which a heat radiating member according to an exemplary embodiment is embedded.

FIG. 3 is a cross-sectional view schematically illustrating a printed circuit board in which a heat radiating member according to an exemplary embodiment is embedded.

With reference to FIGS. 1 to 3, a printed circuit board according to an exemplary embodiment includes a heat radiating member 10 including a body region 12 having a first main surface 1 and a second main surface 2 opposing each other and lateral surfaces 3 and 4 connecting the first main surface 1 to the second main surface 2 and having concave surfaces, and a curved surface region 14 formed to have a convex surface on an edge at which at least one of the first main surface 1 and the second main surface 2 meets the lateral surfaces 3 and 4; and a resin 20 formed to surround the heat radiating member.

The heat radiating member 10 embedded in a printed circuit board may serve to radiate heat generated by an electronic component which is embedded or surface mounted, through the printed circuit board.

The heat radiating member 10 may be mounted inside a cavity formed in a core unit 22.

An inner layer circuit pattern may be formed on an upper surface and a lower surface of the core unit 22, and the inner layer circuit pattern may be insulated by an insulation portion 24.

The body region 12 may be formed of a conductive metal. The conductive metal may be copper (Cu), but is not limited thereto.

A thickness of the body region 12 may be determined according to the type of printed circuit board in which the heat radiating member 10 is to be embedded. The thickness thereof may be 250 μm or less, but is not limited thereto. A width of the body region may be different according to an electronic component and a circuit pattern.

A surface of the body region 12 may have surface roughness properties through a surface treatment.

By the surface treatment, a range of a radius of curvature of the curved surface region may be controlled. The surface treatment may be performed by a physical or chemical treatment method.

When an indentation from an end of the first main surface or an end of the second main surface to a maximum concave position of the lateral surfaces is a side portion, a width $W_e$ of the side portion may be within a range of 5 μm to 50 μm.

In a case in which the width $W_e$ of the side portion is less than 5 μm, a structure in which the side portion and a resin are adhered to each other is not obtained when the heat radiating member is embedded in a substrate. In a case in which the width $W_e$ of the side portion exceeds 50 μm, a distance in which a resin is moved inwardly of the body region is greater, and thus, adhesion between the side portion and the resin may be decreased.

The curved surface region 14 may be formed of the same material as that forming the body region. The material thereof may be a material including copper (Cu), but is not limited thereto.

The curved surface region 14 may be formed by plating a surface of the body region, and the curved surface region 14 and the body region 12 may be integrated, such that a boundary therebetween may not be visible to the naked eye.

A size of a radius of curvature of the curved surface region 14 may be controlled by a surface treatment of the body region.

When the size of a radius R of curvature of the curved surface region is controlled to be increased, the width of a side portion may be decreased, thereby reducing a delamination defect.

Table 1 describes a radius R of curvature of a curved surface region according to the presence and absence of a surface treatment on a body region, a width $W_e$ of a side portion, a step portion $T_g$ between a curved surface region and a first main surface or a second main surface of a body region, and the presence or absence of substrate reliability.

In the case of the presence or absence of substrate reliability, the substrate reliability is determined according to whether of occurrence of delamination at an interface between the resin 20 and the heat radiating member 10 inside a substrate. When delamination occurs, the absence of substrate reliability is determined.

TABLE 1

| Sample | Presence or absence of a surface treatment (○, X) | Radius (μm) of curvature of a curved surface region | Width (μm) of a side portion | Step portion (μm) of a curved surface region and a body region | Substrate reliability (○, X) |
|---|---|---|---|---|---|
| 1 | X | 2.39 | 33.25 | 0.00 | X |
| 2 | | 3.06 | 28.78 | 0.00 | |
| 3 | | 2.81 | 29.28 | 0.00 | |
| 4 | | 2.10 | 30.27 | 0.00 | |
| 5 | | 3.04 | 30.77 | 0.00 | |
| 6 | | 3.23 | 30.27 | 0.00 | |
| 7 | | 3.18 | 31.26 | 0.00 | |
| 8 | | 2.82 | 29.28 | 0.00 | |
| 9 | | 2.38 | 32.26 | 0.00 | |
| 10 | | 2.04 | 28.29 | 0.00 | |
| 11 | ○ | 18.60 | 25.31 | 4.00 | ○ |
| 12 | | 17.67 | 28.78 | 4.60 | |
| 13 | | 22.12 | 25.31 | 2.0 | |
| 14 | | 29.10 | 27.29 | 2.40 | |
| 15 | | 23.52 | 27.79 | 4.60 | |
| 16 | | 17.29 | 26.30 | 2.00 | |
| 17 | | 16.54 | 29.28 | 4.00 | |
| 18 | | 19.13 | 25.80 | 5.00 | |
| 19 | | 24.42 | 32.75 | 7.80 | |
| 20 | | 23.61 | 25.80 | 6.00 | |
| 21 | X | 2.04 | 28.78 | 0.00 | X |
| 22 | | 2.17 | 29.28 | 0.00 | |
| 23 | | 2.59 | 35.73 | 0.00 | |
| 24 | | 2.35 | 32.26 | 0.00 | |
| 25 | | 3.06 | 27.29 | 0.00 | |
| 26 | | 1.93 | 29.77 | 0.00 | |
| 27 | | 1.96 | 30.27 | 0.00 | |
| 28 | | 3.04 | 21.34 | 0.00 | |
| 29 | | 2.63 | 31.76 | 0.00 | |
| 30 | | 2.77 | 33.25 | 0.00 | |
| 31 | ○ | 17.26 | 29.28 | 3.60 | ○ |
| 32 | | 31.88 | 30.77 | 4.20 | |
| 33 | | 18.90 | 28.29 | 3.60 | |
| 34 | | 19.52 | 29.77 | 8.00 | |
| 35 | | 15.92 | 26.30 | 3.80 | |
| 36 | | 17.45 | 29.77 | 3.40 | |
| 37 | | 15.56 | 30.77 | 3.80 | |

TABLE 1-continued

| Sample | Presence or absence of a surface treatment (○, X) | Radius (μm) of curvature of a curved surface region | Width (μm) of a side portion | Step portion (μm) of a curved surface region and a body region | Substrate reliability (○, X) |
|---|---|---|---|---|---|
| 38 | | 19.84 | 30.77 | 3.00 | |
| 39 | | 17.89 | 27.79 | 3.60 | |
| 40 | | 21.15 | 28.78 | 4.40 | |

With reference to Table 1, in a case of a sample which is surface treated, in comparison a sample which is not surface treated, a size of a radius of curvature of a curved surface region is confirmed to be increased. In addition, as the size of a radius of curvature of a curved surface region is increased, a step portion between a curved surface region and a first main surface or a second main surface of a body region is confirmed to be formed. Thus, as adhesion between the heat radiating member and the resin is increased, a delamination defect may be prevented and substrate reliability may be improved.

When a virtual circle is drawn inside the curved surface region 14 and a radius of the circle is a radius R of curvature of the curved surface region, the radius R of curvature of the curved surface region may be within a range of 2 μm to 40 μm.

When the radius R of curvature of the curved surface region is within the range of 2 μm to 40 μm, a delamination defect at an interface between the heat radiating member 10 embedded inside a substrate and the resin 20 may be prevented.

When the thickness of the step portion is within the range of 2 μm to 20 μm, a delamination defect at an interface between the heat radiating member 10 embedded inside a substrate and the resin 20 may be prevented.

In a case in which the radius of curvature of the curved surface region is less than 2 μm, an effect of preventing a delamination defect may be not secured. In a case in which the radius of curvature of the curved surface region exceeds 40 μm, when the heat radiating member is embedded in the same substrate, as a height of the heat radiating member is increased, it may become difficult to embed the heat radiating member in the substrate.

An upper portion of the curved surface region 14 may be located higher or lower than the first main surface 1 or the second main surface 2 of the body region 12 according to a surface treatment method. In the heat radiating member according to an exemplary embodiment, an upper portion of the curved surface region 14 may be located higher than the first main surface 1 or the second main surface 2, but is not limited thereto.

Thus, a step portion $T_g$ may be formed between the curved surface region 14 and the first main surface 1 or the second main surface 2 of the body region 12.

Due to the step portion $T_g$ between the curved surface region 14 and the first main surface 1 or the second main surface 2 of the body region 12, a surface area of the edge at which the resin contacts the heat radiating member is increased, adhesion between the resin and the heat radiating member may be improved by an anchoring effect of the resin.

In other words, the heat radiating member 10 includes the curved surface region 14 to structurally control the shape of the edge of the body region, thereby preventing a delamination defect inside a substrate.

Table 2 describes a step portion between a curved surface region and a body region according to a radius of curvature of a curved surface region, acceptance or rejection of a thickness standard of a body region, and the presence or absence of substrate reliability.

With regard to acceptance or rejection of a thickness standard of a body region, a thickness of a body region allows the body region to have a curved surface region, to maximally implement heat radiation characteristics, and to be embedded inside a substrate. When a standard thickness range is not satisfied thereby, the thickness standard of the body region is rejected.

TABLE 2

| Classification | Radius (μm) of a curved surface region | Average step portion (μm) of a curved surface region and a body region | Maximum step portion (μm) of a curved surface region and a body region | Thickness standard (○, X) of a body region | Substrate reliability (○, X) |
|---|---|---|---|---|---|
| 1 | 0.5 | 0.0 | 0.0 | ○ | X |
| 2 | 1.0 | 0.0 | 0.0 | ○ | X |
| 3 | 2.0 | 0.0 | 0.0 | ○ | ○ |
| 4 | 3.0 | 0.0 | 0.0 | ○ | ○ |
| 5 | 4.0 | 0.0 | 0.8 | ○ | ○ |
| 6 | 5.0 | 1.3 | 3.4 | ○ | ○ |
| 7 | 10.0 | 2.8 | 5.1 | ○ | ○ |
| 8 | 20.0 | 4.2 | 7.9 | ○ | ○ |
| 9 | 30.0 | 6.5 | 10.0 | ○ | ○ |
| 10 | 40.0 | 8.4 | 11.1 | ○ | ○ |
| 11 | 50.0 | 10.5 | 13.2 | X | ○ |

With reference to Table 2, when a radius of curvature of a curved surface region is in a range of 2 μm to 40 μm, a thickness standard of a body region and substrate reliability are satisfied.

In a case in which a radius R of curvature of the curved surface region is less than 2 μm, structural characteristics for adhering a resin to a heat radiating member are not obtained. Thus, an effect of preventing of a delamination defect is determined not to be secured.

When the thickness of the step portion is within the range of 2 μm to 20 μm, a delamination defect at an interface between the heat radiating member 10 embedded inside a substrate and the resin 20 may be prevented.

In a case in which the radius R of curvature of the curved surface region exceeds 40 μm, when the heat radiating member is embedded in the same substrate, as a height of the heat radiating member is increased, it may be difficult to embed the heat radiating member in the substrate. Furthermore, in a case in which a body region is surface treated for a long period of time to allow a radius of curvature of the curved surface region to be formed to be larger, the body region may be thinner than a body region defined in a standard. The thinner body region is determined not to be able to secure heat radiation characteristics in comparison with the body region defined in the standard.

The resin 20 may be an insulating resin. The resin 20 may be an epoxy resin, for example, but is not limited thereto.

The resin 20 serves to fix an electronic component or a heat radiating member 10 embedded in a substrate, and serves to insulate the electronic component or the heat radiating member from an external environment at the same time.

A circuit pattern may be formed on the resin 20. Circuit patterns formed on upper and lower surfaces of the printed circuit board, respectively, may be connected to each other through a via hole 26.

An inside of the via hole 26 may be filled with solder resist.

The via hole 26 may pass through the resin to be connected to the heat radiating member.

The via hole 26 connected to the heat radiating member 10 may be a path for the movement of heat generated inside a substrate.

As set forth above, according to exemplary embodiments in the present disclosure, a heat radiating member according to an exemplary embodiment may allow adhesion with a resin to be improved, thereby improving the reliability of the circuit board.

While exemplary embodiments have been shown and described above, it will be apparent to those skilled in the art that modifications and variations could be made without departing from the scope of the present invention as defined by the appended claims.

What is claimed is:

1. A heat radiating member comprising:
a body region including a first main surface and a second main surface opposing each other, and lateral surfaces connecting the first main surface and the second main surface and having concave surfaces; and
a curved surface region formed to have a convex surface on an edge at which at least one of the first main surface and the second main surface meets one of the lateral surfaces,
wherein a step portion is provided between the curved surface region and the first main surface or the second main surface of the body region, and
the step portion has a thickness within a range of 2.0 μm to 8.4 μm.

2. The heat radiating member of claim 1, wherein when a virtual circle is drawn inside the curved surface region and a radius of the virtual circle is a radius of curvature of the curved surface region, the radius of curvature of the curved surface region is within a range of 2 μm to 40 μm.

3. The heat radiating member of claim 1, wherein a width between an end of the first main surface and the second main surface and a maximum concave position of the lateral surfaces is within a range of 5 μm to 50 μm.

4. The heat radiating member of claim 1, wherein the body region is formed of copper (Cu).

5. The heat radiating member of claim 1, wherein the curved surface region is formed of copper (Cu).

6. The heat radiating member of claim 1, wherein the first main surface and the second main surface of the body region have surface roughness properties.

7. The heat radiating member of claim 1, wherein a thickness of the body region is 250 μm or less.

* * * * *